United States Patent
Shen et al.

[11] Patent Number: 5,920,221
[45] Date of Patent: Jul. 6, 1999

[54] RC DELAY CIRCUIT FOR INTEGRATED CIRCUITS

[75] Inventors: Chiun-Chi Shen; Yen-Tai Lin, both of Hsinchu; Jiang-Hong Ho, Kaoshung; Jack-Lian Kuo, Tainan; Howard Clayton Kirsch, Taoyuan, all of Taiwan

[73] Assignee: Vanguard International Semiconductor Corporation, Hsin-Chu, Taiwan

[21] Appl. No.: 08/892,216

[22] Filed: Jul. 14, 1997

[51] Int. Cl.⁶ .................................................... H03K 5/13
[52] U.S. Cl. ......................... 327/264; 327/278; 327/285
[58] Field of Search ................................. 327/261, 263, 327/264, 276, 277, 278, 281, 283, 285, 288

[56] References Cited

U.S. PATENT DOCUMENTS

| | | | |
|---|---|---|---|
| 4,707,626 | 11/1987 | Inoue | 307/625 |
| 5,263,000 | 11/1993 | Van Buskirk et al. | 365/226 |
| 5,479,132 | 12/1995 | Verhaeghe et al. | 327/553 |
| 5,511,026 | 4/1996 | Cleveland et al. | 365/189.09 |
| 5,767,719 | 6/1998 | Furuchi et al. | 327/281 |
| 5,793,238 | 8/1998 | Baker | 327/262 |

*Primary Examiner*—Timothy P. Callahan
*Assistant Examiner*—Eunja Shin
*Attorney, Agent, or Firm*—George O. Saile; Stephen B. Ackerman

[57] ABSTRACT

This invention describes a delay circuit for integrated circuits that has the capability to delay the rising and falling transitions separately and independent of each other. A signal is fed through an RC network to a Schmitt trigger and then through an inverter to the output of the delay circuit. Two MOS transistors are connected as capacitors and in parallel but in opposing directions between the delay circuit output and the input to the Schmitt trigger to form part of the RC network. The biasing of the two transistors is such that the inversion layer capacitance is active in only one transistor for each signal transition. Thus the falling and rising transition of an input signal can be delayed separately. Changing the gate and channel size in one transistor acting as a capacitor changes the delay in one signal transition. Changing the other gate and channel size changes the delay in the other transition. The output of the delay circuit is fed back through the transistor capacitors to hasten the switching of the Schmitt trigger.

17 Claims, 3 Drawing Sheets

RC DELAY CIRCUIT FOR INTEGRATED CIRCUITS

BACKGROUND OF THE INVENTION

1. Field of Invention

This invention relates to integrated circuits and more particularly to delay circuits for use within CMOS integrated circuits.

2. Description of Related Art

In integrated circuits there is a need to have a delay circuit to provide signal delays for various functions. Delay circuits can be found in internal clock generation for clock signals in a DRAM and in power supplies internal to semiconductor chips to control the timing of pump voltages. Setup and hold time is an important specification requiring the delay of signals for an asynchronous DRAM in controlling RAS, CAS, address and data and in a synchronous DRAM for producing the various clocks and controlling data and address.

In U.S. Pat. No. 4,707,626 (Inoue) is shown a delay circuit for internal clock generation. This invention uses an RC network with a cross coupled nor gate as a single shot multivibrator. A MOS transistor is used as a resistor so that the resistance can vary with changes in the power supply and the capacitor is across the input of an inverter stage to vary the trip point with threshold voltage.

A power supply internal to an integrated circuit is discussed in U.S. Pat. No. 5,263,000 (Buskirk et al.) and uses an RC network in conjunction with a Schmitt trigger to produce a delay circuit to control a pump gate for supplying regulated power to the drains of flash EEPROM memory cells. Similarly, U.S. Pat. No. 5,511,026 (Cleveland et al.) shows a delay circuit using an RC network in conjunction with a Schmitt trigger for use with pump gates for an internal power supply providing power to the gates of a flash EEPROM memory cells.

In all cases the delay circuits provide only one RC combination for use in any one delay circuit. Thus the delay of the rising and falling transitions of a signal are controlled with the same delay. A wide variation of rising and falling delays and differences in trigger points results in unbalanced signals. This makes it difficult to achieve set up and hold for all cases in the production of a product. A delay circuit with separate delay control of the rising and falling transitions is needed to overcome the wide variations in delay between rising and falling transitions.

SUMMARY OF THE INVENTION

This invention is a delay circuit wherein the output is fed back to sharpen the delayed transitions, and two capacitance devices are used to delay separately the rising and falling transitions of the input waveform. The delay circuit consists of an RC network connected to a Schmitt trigger that drives an inverter circuit to produce an output. The input to the delay circuit is connected to the resistance device of the RC network. The resistance device is an NI-PI transmission gate having a channel with an NI gate on one side connected to circuit bias and an PI gate on the other side connected to circuit ground. The input and output of the NI-PI transmission gate are connected on opposite ends of the channel, and having a resistance between input and output that varies as circuit bias.

Two capacitance devices are connected in parallel to the output of the resistance device which in turn is connected to the input of the Schmitt trigger. The opposite ends of the two capacitance devices, which are in opposing orientation, are connected to the output of the delay circuit. This provides feedback of the output of the delay circuit to the input of the Schmitt trigger, and hastens the switching of the Schmitt trigger once the switching threshold has been reached. The feedback of the output of the delay circuit to the input of the Schmitt trigger completes the transition of the input of the Schmitt trigger to full rail voltage, and initializes the circuit for the next transition.

The two capacitors are constructed from MOS transistors where the gate of the first transistor is connected to the RC network, and the source and drain are connected together and further connected to the output of the delay circuit. The gate of the second MOS transistor is connected to the output of the delay circuit, and its source and drain are connected together and to the RC network. The connection of these two MOS transistor capacitance devices are thus connected in parallel and in opposite direction between the delay circuit output and the input of the Schmitt trigger.

When a rising transition is applied to the delay circuit input, the output of the delay circuit is initially low, and a positive voltage is built up across the gate to source-drain of the first MOS transistor capacitance device having its gate connected to the Schmitt trigger. This positive gate to source-drain voltage produces high capacitance resulting from the charge buildup in the channel inversion layer. The second MOS transistor capacitance device having its gate connected to the output of the delay circuit is biased opposite to the first transistor capacitance device, producing no inversion layer in the presence of a rising signal transition and very small gate to source-drain capacitance.

When a falling transition is applied to the delay circuit input, the output of the delay circuit is initially high, and a positive voltage is built up across the gate to source-drain of the second MOS transistor capacitance device having its gate connected to the delay circuit output. This positive gate to source-drain voltage produces high capacitance resulting from the charge buildup in the channel inversion layer. The first MOS transistor capacitance device having its gate connected to the to the Schmitt trigger is biased opposite to the second transistor capacitance device, producing no inversion layer in the presence of a falling signal transition and very small gate to source-drain capacitance.

Thus the two MOS transistor capacitance devices connected in opposite directions each produce a controlling capacitance for a different signal transition. This allows the delay to be adjusted separately for the rising and the falling transitions by adjusting the amount of capacitance in the respective transistor capacitance device. The amount of capacitance is adjusted to by changing the size of the gate and channel of the respective MOS transistor capacitance device.

BRIEF DESCRIPTION OF THE DRAWINGS

This invention will be described with reference to the accompanying drawings, wherein.

DETAILED DESCRIPTION OF THE PREFERRED EMBODIMENT

Figure 1A:
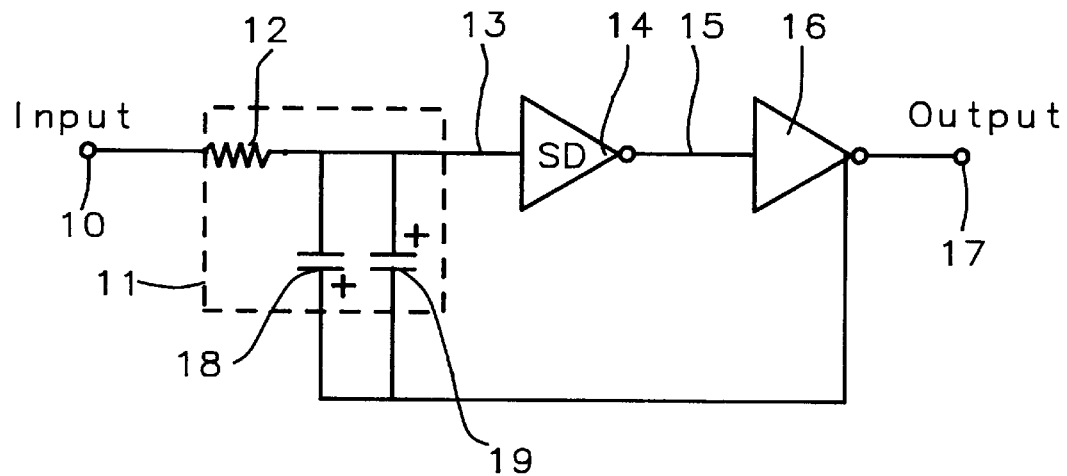
FIG. 1a is a schematic diagram of the invention.

In FIG. 1a shows an equivalent circuit of the delay circuit of this invention. The input 10 of the delay circuit is connected to an RC network 11. A resistance device is connected to the input 13 of a signal detector (SD) 14. The output 15 of the signal detector 14 is connected to an inverter circuit 16. The output of the inverter circuit forms the output 17 of the delay circuit. Two capacitor devices 18 19 form part of the RC network 11 and are connected between the input 13 of the signal detector 14 and the output of the delay circuit 17. The two capacitance devices 18 19 are polarized in a sense that if a voltage is applied in one direction across the capacitance devices 18 19 a large capacitance will occur, and if the voltage is reversed, little capacitance will occur.

A "+" sign is shown in FIG. 1a next to the terminal of the capacitance devices 18 19 to indicate to which terminal a positive voltage must be applied to produce a large capacitance. If the voltage of the output of the delay circuit 17 is positive with respect to the input of the signal detector, then capacitance device 18 is at high capacitance and capacitance device 19 is at low capacitance. If the voltage of the input of the signal detector 13 is positive with respect to the output of the delay circuit 17, then capacitance device 19 is at high capacitance and capacitance device 18 is at low capacitance.

Continuing to refer to FIG. 1a, before a rising transition the voltage at the output of the delay circuit 17 is low and the input to the signal detector 13 is low. The capacitance of both capacitance devices 18 19 is low. When a rising transition is applied to the input of the delay circuit 10, the voltage at the input of the signal detector 13 begins to rise. As the voltage at the input to the signal detector 13 begins to rise, a positive voltage begins to appear across the first capacitance device 19 from the input of the signal detector 13 to the output of the delay circuit 17, and the capacitance of the first capacitance device 19 begins to rise. Capacitance of the second capacitance device 18 continues to be low since this device is biased negatively from its gate to source-drain. As the capacitance of the first capacitance device 19 becomes high, the delay circuit 11 delays the input signal. At some voltage level the signal detector 14 triggers and the voltage at the output of the delay circuit 17 begins to rise. This rising voltage at the output of the delay circuit 17 is fed back to the input of the signal detector 13 through the first capacitance device 19 and the switching of the signal detector 14 is hastened to completion. The delay circuit then stabilizes at a high voltage at the input of the delay circuit 10, the input of the signal detector 13 and the output of the delay circuit 17. The capacitance of both capacitance devices 18 19 is low.

Just before a falling transition next occurs the voltage at the output of the delay circuit 17 is high and the input to the signal detector 13 is high. The capacitance of both capacitance devices 18 19 is low. When a falling transition is applied to the input of the delay circuit 10, the voltage at the input of the signal detector 13 begins to fall. As the voltage at the input to the signal detector 13 begins to fall, a positive voltage begins to appear across the second capacitance device 18 from the output of the delay circuit 17 to the input 13 of the signal detector 14, and capacitance of second capacitance device 18 begins to rise. The capacitance of first capacitance device 19 continues to be low since this device is biased negatively from its gate to source-drain. As the capacitance of the second capacitance device becomes high the delay circuit 11 delays the input signal. At some voltage level the signal detector 14 triggers and the voltage at the output of the delay circuit 17 begins to fall. This falling voltage at the output of the delay circuit 17 is fed back to the input of the signal detector 13 through the second capacitance device 18 and the switching of the signal detector 14 is hastened to completion. The delay circuit then stabilizes at a low voltage at the input of the delay circuit 10, the input of the signal detector 13 and the output of the delay circuit 17. The capacitance of both capacitance devices 18 19 is low.

Figure 1B:
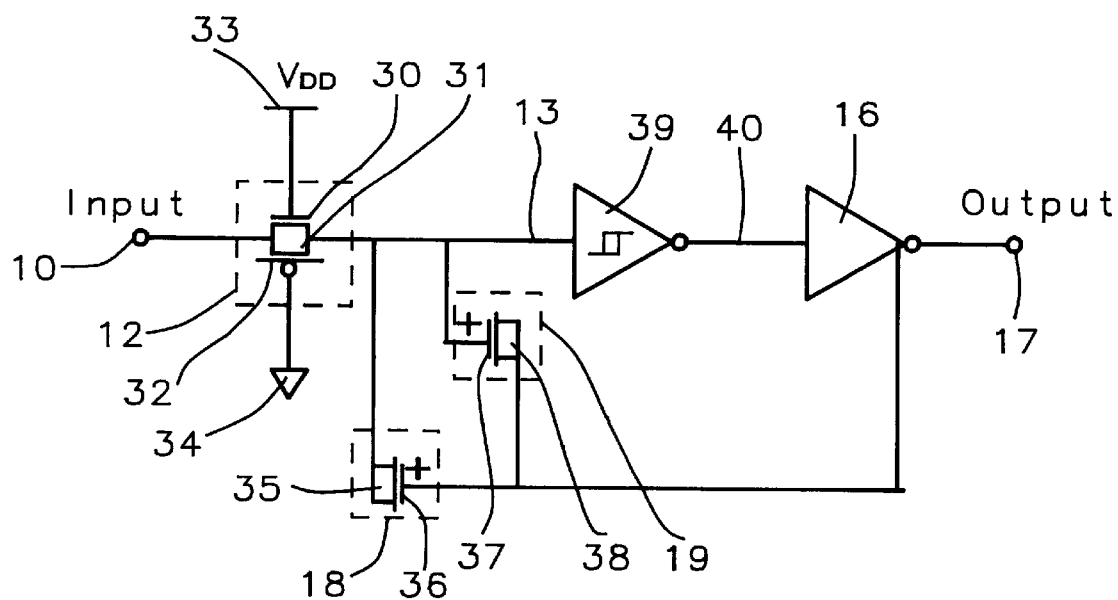
FIG. 1b is a schematic diagram showing the connection of the actual delay elements.

In FIG. 1b is shown the equivalent circuit of FIG. 1a with the resistive 12 and capacitance circuit elements 18 19 replaced with actual circuit elements and the signal detector 14 as a Schmitt trigger 39. The resistive device 12 is an NI-PI transmission gate with a channel 31 connected between the delay circuit input 10 and the input 13 of a Schmitt trigger 39. The NI gate 30 of the NI-PI transmission gate is connected to circuit bias 33, and the PI gate 32 is connected to circuit ground 34. The connection of the two gates 30 32 between circuit bias 33 and circuit ground 34 allows the resistance to vary as circuit power supply voltage 33 34 varies. The two capacitance devices 18 and 19 are MOS transistors with source and drain connected together 35 38 to form one terminal of each capacitor and the second capacitor terminal being the gates 36 37 of the MOS transistors. When the voltage across the MOS transistors from the gate 36 37 to the source-drain 35 38 is positive, the capacitance of the transistors is high as a result of an inversion layer. When the voltage is reverse there is little to no capacitance. As can be seen in FIG. 1b the two MOS transistors 18 19 are connected in opposite directions in correspondence with FIG. 1a and the "+" signs. Thus transistor 19 becomes capacitive with a rising signal transition, and transistor 18 become capacitive with a falling transition as explain with FIG. 1a. Changing the size of the gate and channel of transistor device 18 changes the capacitance and in turn changes the delay of a falling transition. In like manner, changing the size of the gate and channel of transistor device 19 changes the capacitance and in turn changes the delay of a rising transition.

Figure 1C:
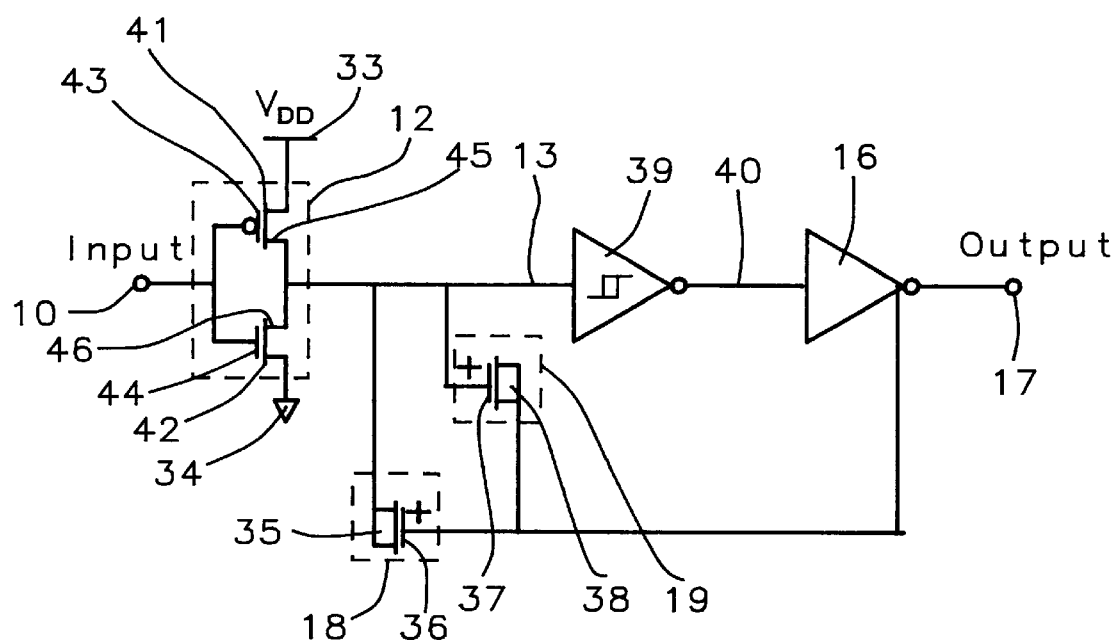
FIG. 1c is a schematic diagram showing an alternate connection of delay elements.

Referring to FIG. 1c, an alternate means is shown for providing the resistance element 12 for the RC network 11 shown in FIG. 1a. A P-channel transistor 41 and an N-channel transistor 42 are connected together 45 46 and between circuit bias 33 and circuit ground 34. The output 45 46 of the two transistors 41 42 are connected to the input of the Schmitt trigger 13 and gates 43 44 are connected together and to delay circuit input 10. The P-channel transistor 41 and the N-channel transistor 42 are designed with a small width to length ratio so as to provide a high channel resistance. When a rising signal is applied to the two transistors 41 42 through the input 10, the N-channel transistor 42 conducts and a delayed rising signal is connected to the input 13 of the Schmitt trigger 39. The delay of the signal at the Schmitt trigger input 13 is a result of the resistance of the N-channel transistor 42 and the capacitance of the capacitive device 19. The capacitance of the capacitive device 19 being formed as a result of the rising transition at the input 13 of the Schmitt trigger 39 which produces a positive bias from the Schmitt trigger input 13 to the delay circuit output 17. This positive bias produces a high capacitance resulting from the charge build up in the channel inversion layer and allows the feedback of the delay circuit output 17 to the Schmitt trigger input 13. At a threshold voltage of the input 13, the Schmitt trigger 39 switches, connecting the signal at the Schmitt trigger input 13 to the delay circuit output 17 through the inverter circuit 16. The rising signal at the delay circuit output 17 is fed back to the input 13 of the Schmitt Trigger 39 through the capacitive device 19 having its gate 37 connected to the input 13 of the Schmitt trigger 39. This feedback hastens the switching to completion of the Schmitt trigger 39 and initializes the circuitry for the next transition.

Continuing to refer to FIG. 1c, when a falling signal is applied to the two transistors 41 42 through the input 10, the P-channel transistor 41 conducts and a delayed falling signal is connected to the input 13 of the Schmitt trigger 39. The delay of the falling signal at the Schmitt trigger input 13 is a result of the resistance of the P-channel transistor 41 and the capacitance of the capacitive device 18. The capacitance of the capacitive device 18 being formed as a result of the falling transition at the input 13 of the Schmitt trigger 39 which produces a positive bias from the delay circuit output 17 to the Schmitt trigger input 13. This positive bias produces a high capacitance resulting from the charge build up in the channel inversion layer and allows the feedback of the delay circuit output 17 to the Schmitt trigger input 13. At a threshold voltage of the Schmitt trigger input 13, the Schmitt trigger 39 switches, connecting the signal at the Schmitt trigger input 13 to the delay circuit output 17 through the inverter circuit 16. The falling signal at the delay circuit output 17 is fed back to the input 13 of the Schmitt Trigger 39 through the capacitive device 18 having its gate 36 connected to the delay circuit output 17. This feedback hastens the switching to completion of the Schmitt trigger 39 and initializes the circuitry for the next transition.

Figure 2:
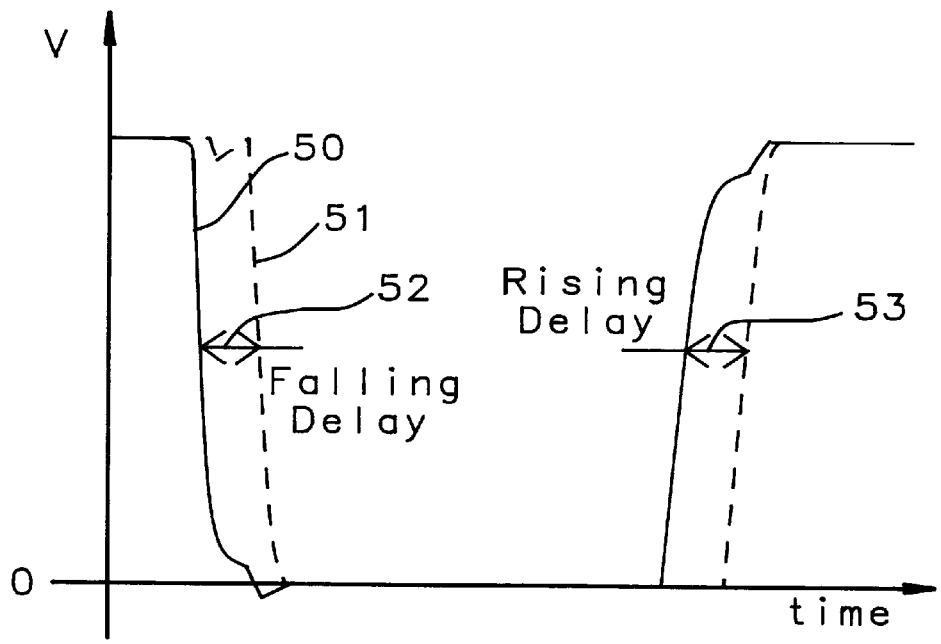
FIG. 2 shows the input and output wave forms.

In FIG. 2 is shown an input signal 50 to the delay circuit and the corresponding output signal 51. The falling delay 52 between these two signals 50 and 51 is controlled by the time constant of the RC network 11 and is adjusted by changing the size of the gate and channel of the MOS transistor 18 with its gate 36 connected to the output of the delay circuit 17. The rising delay 53 between these two signals 50 and 51 is controlled by the time constant of the RC network 11 and is adjusted by changing the size of the gate and channel of the MOS transistor 19 with its gate 37 connected to the input 13 of the Schmitt Trigger 39 (or signal detector 14 in FIG. 1a).

Figure 3:
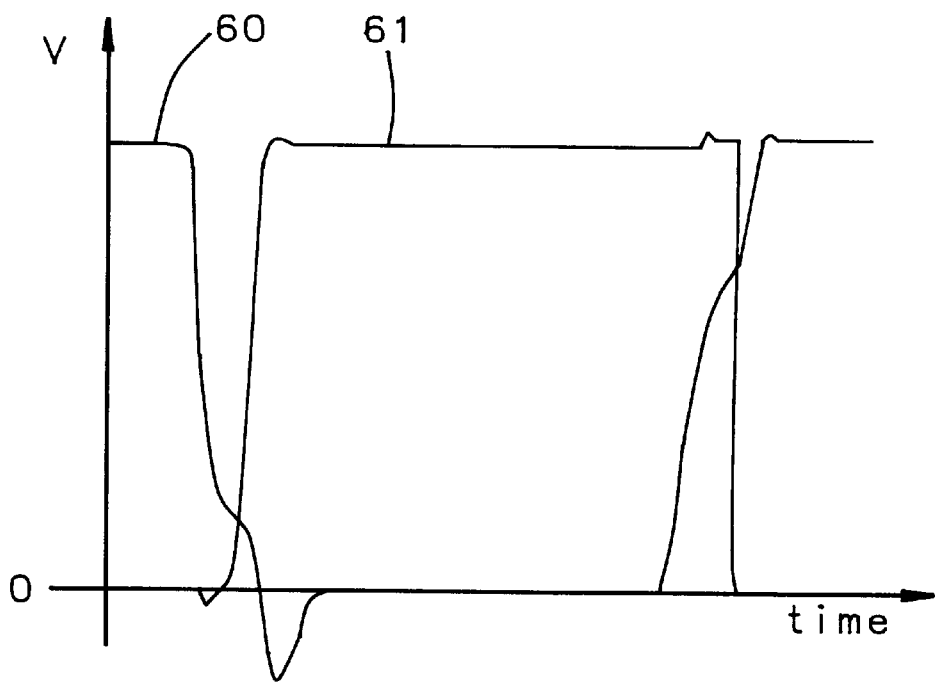
FIG. 3 shows the wave forms of the intermediate points of the invention.

FIG. 3 shows the voltage waveform of the signal 60 at the input 13 to the Schmitt trigger 39 (or signal detector 14 in FIG. 1a) and the signal 61 at the output of the Schmitt trigger 39. One can see the distortions from the RC network 11 in signal 60 at the input 13 to the Schmitt trigger 39, and the shaping of the signal 61 at the output of the Schmitt trigger 40 as a result of both the feedback through capacitor devices 18 19 and the switching of the Schmitt trigger 39 (14 in FIG. 1a).

While the invention has been particularly shown and described with reference to preferred embodiments thereof, it will be understood by those skilled in the art that various changes in form and details may be made without departing from the spirit and scope of the invention.

What is claimed is:

1. An integrated delay circuit with separate delay for rising and falling transitions, comprising:
    a) a delay circuit input and a delay circuit output,
    b) a delay network with a first and second adjustable delay element,
    c) a signal detector connected to an inverter,
    d) said delay circuit input connected to input of the delay network,
    e) the delay network providing said first adjustable delay element to control delay of a falling transition of an input signal and said second adjustable delay element to control delay of a rising transition of the input signal,
    f) output of the delay network connected to input of the signal detector,
    g) output of said signal detector connected to said delay circuit output through said inverter,
    h) said delay circuit output fed back to input of said signal detector to hasten input signal transitions to completion and initialize circuitry for the next input signal transition.

2. The integrated delay circuit of claim 1, wherein the delay network is an RC circuit, comprising:
    a) resistance of the RC circuit formed by a transmission gate device connected between the input of the delay network and the output of the delay network,
    b) gate of NMOS transistor of the transmission gate device connected to voltage bias,
    c) gate of PMOS transistor of the transmission gate device connected to circuit ground,
    d) capacitance of the RC circuit formed by the first and second adjustable delay elements as a first and second MOS device connected in parallel and in opposition between the output of the delay network and the delay circuit output,
    e) gate of said first MOS device connected to the output of the delay network with source-drain of the first MOS device connected to the delay circuit output,
    f) source-drain of said second MOS device connected to the output of the delay network with gate of the second MOS device connected to the delay circuit output.

3. The delay network of claim 1, wherein the delay network contains a resistance which is established by a P-channel and an N-channel transistor connected in series between circuit bias and circuit ground, comprising:
    a) gate of the P-channel transistor connected to gate of the N-channel transistor and connected to the input of the delay network,
    b) output of P-channel transistor and the N-channel transistor connected together and to the output of the delay network,
    c) resistance of the P-channel transistor and the N-channel transistor established by the width to length ratio of the channels of each device,
    d) the N-channel transistor conducting for rising input signal transitions,
    e) the P-channel transistor conducting for falling input signal transitions.

4. The delay network of claim 2, wherein the capacitance is a function of voltage across the first and second MOS device, comprising:
    a) a high capacitance value when the gate voltage higher than the source-drain voltage,
    b) a low capacitance value when the gate voltage lower than the source-drain voltage,
    c) capacitance of said first MOS device goes from low to high when input signal to the delay circuit changes from a low voltage to a high voltage,
    d) capacitance of said second MOS device remains low when input signal of the delay circuit changes from a low voltage to a high voltage,
    e) capacitance of said second MOS device goes from low to high when input signal to the delay circuit changes from a high voltage to a low voltage,
    f) capacitance of said first MOS device remains low when input signal of the delay circuit changes from a high voltage to a low voltage,
    g) said first MOS device controlling the delay of a rising transition of delay circuit input signal and said second MOS device controlling the delay of a falling transition of delay circuit input signal.

5. The integrated delay circuit of claim 1, wherein the signal detector is a Schmitt Trigger.

6. A resistance and capacitance controlled delay circuit having transition sensitive capacitance, comprising:
   a) input of delay circuit connected to input of an RC network,
   b) output of the RC network connected to input of a Schmitt trigger,
   c) input to the delay circuit connected through resistance of said RC network to the input of the Schmitt trigger,
   d) the Schmitt trigger connected to an inverter circuit,
   e) inverter circuit output being output of the delay circuit,
   f) output of inverter circuit fed back to input of Schmitt trigger through capacitance of said RC network,
   g) feedback of inverter circuit output signal to the input of the Schmitt trigger accelerating switching of Schmitt trigger,
   h) said capacitance formed by two voltage sensitive devices connected in parallel and in opposite directions between delay circuit output and Schmitt trigger input,
   i) said voltage sensitive devices providing separate and independent delay control for a rising signal transition and a falling signal transition.

7. The resistance and capacitance controlled delay circuit of claim 6, wherein the capacitance is produced by a gate to channel capacitance of two N-channel MOS transistors to separately delay a rising and a falling input signal, comprising:
   a) said two N-channel MOS transistors connected in parallel and opposition between the input of the Schmitt trigger and the output of the delay circuit,
   b) a gate of a first MOS transistor connected to the input of the Schmitt trigger and a source-drain of a second MOS transistor connected to the input of the Schmitt trigger,
   c) source-drain of the first MOS transistor connected to the output of the delay circuit and gate of the second MOS transistor connected to the output of the delay circuit,
   d) a positive voltage between gate and source-drain of the first and the second MOS transistor producing a high capacitance,
   e) a negative voltage between gate and source-drain of the first and the second MOS transistor producing a low capacitance,
   f) said first MOS transistor producing a capacitance to delay a rising input signal,
   g) said second MOS transistor producing a capacitance to delay a falling input signal.

8. The resistance and capacitance controlled delay circuit of claim 7, wherein the amount of said capacitance of the two N-channel MOS transistors is adjusted by varying size of gates of each transistor separately to adjust independently the delay of the rising and falling signal transitions.

9. The resistance and capacitance controlled delay circuit of claim 6, wherein the capacitance is produced by a gate to source-drain capacitance of two P-channel MOS transistors.

10. The resistance and capacitance controlled delay circuit of claim 9, wherein the amount of said capacitance is adjusted by varying size of gate of the P-channel MOS transistors.

11. The resistance and capacitance controlled delay circuit of claim 6, wherein the resistance is established by a P-channel and an N-channel transistor connected in series between circuit bias and circuit ground, comprising:
   a) resistance of the P-channel transistor and the N-channel transistor established by the width to length ratio of the channels of each device,
   b) the N-channel transistor conducting for rising input signal transitions,
   c) the P-channel transistor conducting for falling input signal transitions.

12. The resistance and capacitance controlled delay circuit of claim 6, wherein the amount of said resistance of the RC network is established by circuit metalization between the input and output of the RC network.

13. A delay circuit for integrated circuits, comprising:
   a) an output signal delayed from an input signal,
   b) said input signal connected to an input of a Schmitt trigger by means of an RC low pass network,
   c) said low pass network providing separate and independent delay adjustment of rising and falling transitions of the input signal,
   d) said output signal coupled to an output of the Schmitt trigger fed back to the input of the Schmitt trigger through capacitance of the RC low pass network,
   e) feedback of the output signal of the input of the Schmitt trigger accelerating switching of the delay circuit.

14. A delay circuit for integrated circuits, comprising:
   a) an output signal delayed from an input signal,
   b) said input signal connected to an input of a Schmitt trigger by means of an RC low pass network,
   c) said low pass network providing separate and independent delay adjustment of rising and falling transitions of the input signal,
   d) said output signal coupled to an output of the Schmitt trigger fed back to the input of the Schmitt trigger through capacitance of the RC low pass network,
   e) feedback of the output signal of the input of the Schmitt trigger accelerating switching of the delay circuit,
   f) said capacitance is formed between the gate and source-drain of two MOS transistors,
      1) a first capacitor formed from a first of two MOS transistors connected between delay circuit output and Schmitt trigger input such as to control a rising edge of said input signal,
      2) a second capacitor formed from a second of two MOS transistors connected between the delay circuit output and the Schmitt trigger input such as to control a falling edge of said input signal,
      3) said first capacitor adjusted separately from said second capacitor to provide independent delay control of the rising edge and the falling edge of the input signal.

15. A delay circuit for integrated circuits, comprising:
   a) an output signal delayed from an input signal,
   b) said input signal connected to an input of a Schmitt trigger by means of an RC low pass network,
   c) said low pass network providing separate and independent delay adjustment of rising and falling transitions of the input signal,
   d) said output signal coupled to an output of the Schmitt trigger fed back to the input of the Schmitt trigger through capacitance of the RC low pass network,
   e) feedback of the output signal of the input of the Schmitt trigger accelerating switching of the delay circuit,
   f) said capacitance is formed between the gate and source-drain of a MOS transistor, and is varied by changing the size of the gate.

16. A delay circuit for integrated circuits, comprising:
a) an output signal delayed from an input signal,
b) said input signal connected to an input of a Schmitt trigger by means of an RC low pass network,
c) said low pass network providing separate and independent delay adjustment of rising and falling transitions of the input signal,
d) said output signal coupled to an output of the Schmitt trigger fed back to the input of the Schmitt trigger through capacitance of the RC low pass network,
e) feedback of the output signal of the input of the Schmitt trigger accelerating switching of the delay circuit,
f) a resistance of said RC low pass network is established by a P-channel and an N-channel transistor connected in series between circuit bias and circuit ground,
   1) resistance of the P-channel transistor and the N-channel transistor established by the width to length ratio of the channels of each transistor,
   2) the N-channel transistor conducting for rising input signal transitions,
   3) the P-channel transistor conducting for falling input signal transitions.

17. The delay circuit of claim 13, wherein resistance of said RC low pass network could be formed by signal line resistance.

* * * * *